United States Patent
Zheng et al.

(10) Patent No.: US 7,750,407 B2
(45) Date of Patent: Jul. 6, 2010

(54) STRAPPING CONTACT FOR CHARGE PROTECTION

(75) Inventors: Wei Zheng, Santa Clara, CA (US); Jean Yang, Glendale, CA (US); Mark Randolph, San Jose, CA (US); Ming Kwan, San Leandro, CA (US); Yi He, Fremont, CA (US); Zhizheng Liu, San Jose, CA (US); Meng Ding, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/612,265

(22) Filed: Dec. 18, 2006

(65) Prior Publication Data

US 2008/0142889 A1    Jun. 19, 2008

(51) Int. Cl.
*H01L 29/76* (2006.01)

(52) U.S. Cl. .................. 257/355; 257/356; 257/357; 257/358; 257/359; 257/360; 257/361; 257/362; 257/363; 257/364; 257/365; 257/366; 257/E29.008; 257/E29.015

(58) Field of Classification Search ......... 257/355–366, 257/E29.008, E29.015
See application file for complete search history.

(56) References Cited

U.S. PATENT DOCUMENTS

| | | | |
|---|---|---|---|
| 6,869,844 B1 * | 3/2005 | Liu et al. | 438/264 |
| 6,897,110 B1 | 5/2005 | He et al. | |
| 7,224,205 B2 * | 5/2007 | Kapoor | 327/534 |
| 7,315,066 B2 * | 1/2008 | Atkisson et al. | 257/355 |

* cited by examiner

*Primary Examiner*—Cuong Q Nguyen
*Assistant Examiner*—Trang Q Tran
(74) *Attorney, Agent, or Firm*—Harrity & Harrity, LLP

(57) ABSTRACT

A semiconductor device includes a substrate and a memory cell formed on the substrate. The memory cell includes a word line. The semiconductor device also includes a protection area formed in the substrate, a conductive structure configured to extend the word line to the protection area, and a contact configured to short the word line and the protection area.

20 Claims, 11 Drawing Sheets

STRAPPING CONTACT FOR CHARGE PROTECTION

FIELD OF THE INVENTION

Implementations consistent with the principles of the invention relate generally to semiconductor devices and methods of manufacturing semiconductor devices. The invention has particular applicability to non-volatile memory devices.

BACKGROUND OF THE INVENTION

During the formation of a semiconductor memory cell (e.g., during a metal-1 etch and other etches), word lines tend to acquire high voltage (i.e., the word lines tend to charge up), while the substrate remains at a much lower voltage. This difference in voltage causes Fowler-Nordheim (FN) tunneling to occur through the gate stack and causes the charges to be trapped in the charge storage area of the memory cell. As a result, the initial threshold voltage (Vt) of the memory cell can change. This change in the initial threshold voltage of the memory cell is commonly referred to as in-line process charging, which is a highly undesirable phenomenon. In addition, this charging process also damages the tunnel oxide of the memory cell and causes reliability issues.

Typically, a charging protection structure is connected to the memory arrays to limit the charging effect during the process. A charging protection structure may be a diode structure, or a fuse structure or other structures that would short the memory array to ground once the potential of the word lines of the memory array exceeds a certain voltage level, thus preventing the word lines from charging up to an undesirably high level. The charging protection structure is typically connected to the core array only after metal-1 formation. However, process charging can occur before the metal-1 layer is formed. Therefore, there is a need for a charging protection structure that can protect the memory cells before the metal-1 layer is formed.

SUMMARY OF THE INVENTION

In an implementation consistent with the principles of the invention, a semiconductor device includes a substrate; a memory cell formed on the substrate, where the memory cell includes a word line; a charge protection structure formed in the substrate; and a strapping contact connected to the charge protection structure and to the word line via a polysilicon structure. The strapping contact is configured to short the word line and the charge protection structure.

In another implementation consistent with the principles of the invention, a semiconductor device includes a substrate; a memory cell formed on the substrate, where the memory cell includes a word line; a protection area formed in the substrate; a conductive structure configured to extend the word line to the protection area; and a contact configured to short the word line and the protection area.

In yet another implementation consistent with the principles of the invention, a method for forming a semiconductor device including a substrate is provided. The method includes forming a protection area in the substrate, forming a core structure, forming a conductive structure that extends a portion of the core structure to the protection area, and forming a strapping contact across the conductive structure and the protection area.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
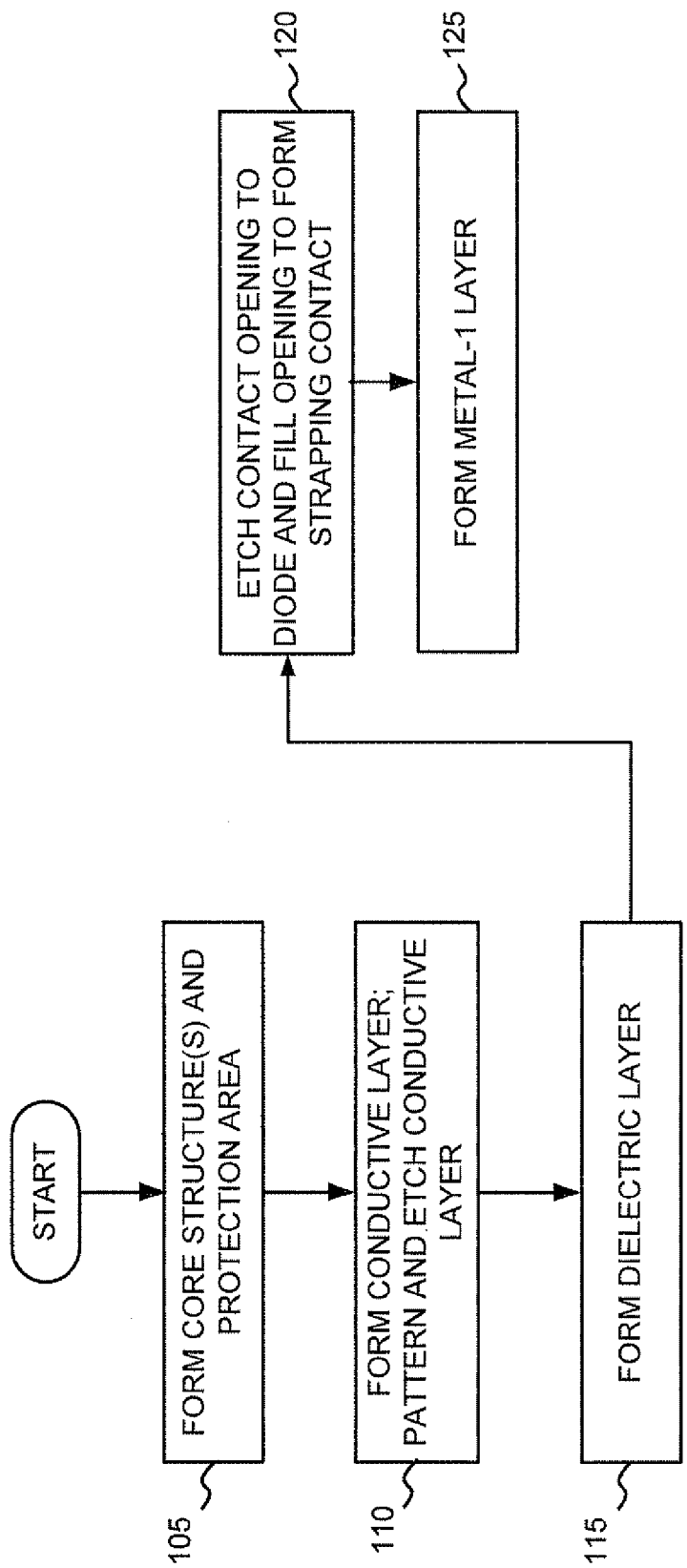
FIG. 1 illustrates an exemplary process for forming a semiconductor memory device in an implementation consistent with the principles of the invention.

FIG. 1 illustrates an exemplary process for forming a semiconductor memory device in an implementation consistent with the principles of the invention. In one implementation, the semiconductor memory device includes a core memory array of a flash memory device. FIGS. 2-9 illustrate exemplary views of a semiconductor memory device fabricated according to the processing described in FIG. 1.

With reference to FIGS. 1 and 2, processing may begin by forming one or more core structures and a protection area (act 105). In some implementations consistent with the principles of the invention, one or more portions of the core structures and one or more portions of the protection area may be formed simultaneously. In other implementations, the core structures may be formed before or after the formation of the protection area.

Figure 2A:
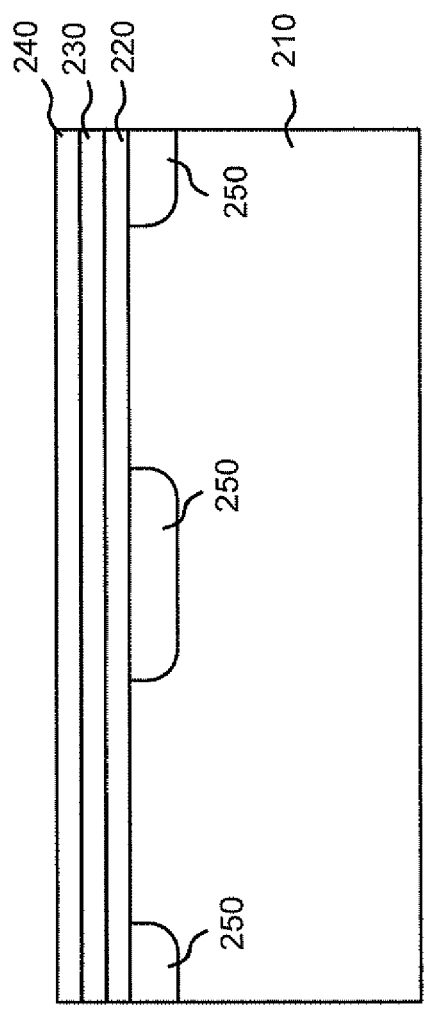
FIGS. 2-9 illustrate exemplary views of a semiconductor memory device fabricated according to the processing described in FIG. 1.
Figure 2B:
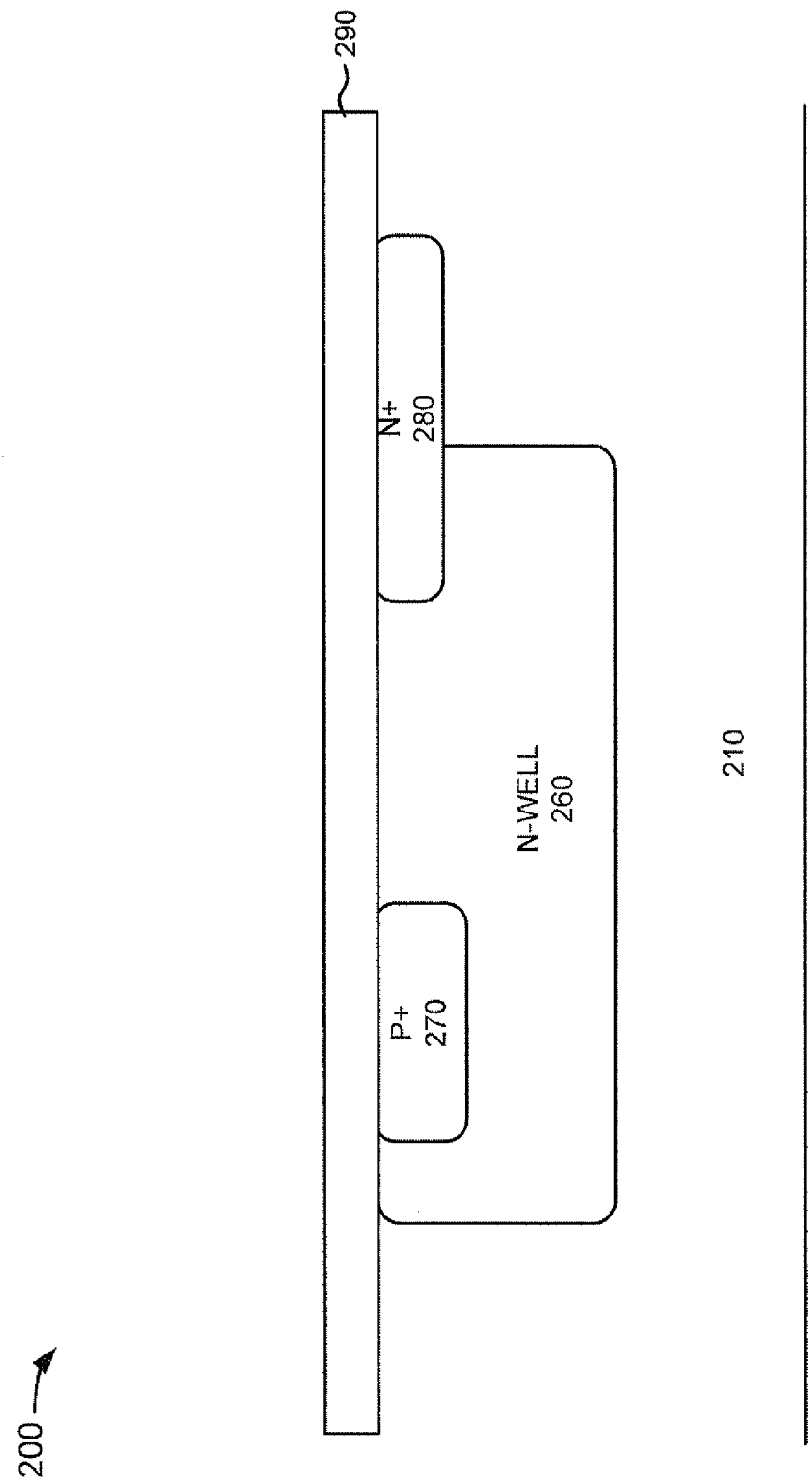

The core structures may include, for example, one or more memory cells (or array(s) of memory cells). Other structures may alternatively be formed. For explanatory purposes, the formation of a portion of an exemplary memory cell array is described. A dielectric layer 220 may be formed on top surface of a layer 210 of semiconductor device 200, as illustrated in FIGS. 2A and 2B, where FIG. 2A corresponds to the core structure area of semiconductor device 200 and FIG. 2B corresponds to the protection area of semiconductor device 200. In one implementation, layer 210 may include a semiconducting material, such as, for example, silicon, germanium or silicon-germanium, doped with, for example, boron or indium, or another material. Layer 210 may act as a substrate of semiconductor device 200.

Dielectric layer 220 may comprise a silicon oxide (e.g., $SiO_2$) and may be deposited using chemical vapor deposition (CVD) (or thermally grown) to a thickness ranging from about 50 Å to about 200 Å. It will be appreciated that dielectric layer 220 may comprise other materials that may be deposited or grown. In the core structure area, dielectric layer 220 may function as a tunnel oxide layer for a subsequently formed memory cell of semiconductor device 200.

For mirrorbit type FLASH memory cells, a dielectric layer 230 may be formed on dielectric layer 220, as illustrated in FIGS. 2A and 2B. In one implementation, dielectric layer 230 may comprise a silicon nitride and may be formed to a thickness ranging from about 50 Å to about 500 Å. It will be appreciated that dielectric layer 230 may comprise other materials that may be deposited or grown. In the core structure area, dielectric layer 230 may function as a charge storage layer for a subsequently formed memory cell of semiconductor device 200. On top of dielectric layer 220, another dielectric layer 240 may be formed. Dielectric layer 240 may comprise a silicon oxide layer formed to a thickness ranging from about 50 Å to about 200 Å. Dielectric layer 240 may be deposited or grown.

For floating gate type FLASH memory cells, a polysilicon floating gate may be formed on dielectric layer 220. This polysilicon floating gate may be lightly doped or undoped and may act as charge storage element. An inter poly oxide-nitride-oxide (ONO) layer may be formed on a top surface of the polysilicon floating gate. This ONO layer may comprise a first oxide layer having a thickness ranging from about 50 Å to about 100 Å, a silicon nitride layer Saving a thickness ranging from about 50 Å to about 100 Å, and a second oxide layer having a thickness ranging from about 50 Å to about 100 Å.

Source/drain junctions or bit lines 250 may be formed in the core structure area of semiconductor device 200, as illustrated in FIG. 2A. To form bit lines 250, an organic bottom anti-reflective coating (BARC) layer may be formed on a top surface of device 200. A bit line mask may be formed on a top surface of the organic BARC layer. The organic BARC layer may be etched using the bit line mask. Bit lines 250 may then be formed using one or more implant processes. For example, bit lines 250 may be formed by a main perpendicular implant process. The main perpendicular implant may be a relatively high concentration implant that is capable of producing bit lines 250. In one implementation, a p-type dopant, such as boron, may be used as the dopant. The p-type dopant atoms may be implanted at a dosage of about $1 \times 10^{13}$ atoms/cm$^2$ to about $1 \times 10^{15}$ atoms/cm$^2$ and an implantation energy of about 4 KeV to about 40 KeV, which may depend on the desired junction depth for bit lines 240. Alternatively, an n-type dopant, such as arsenic or phosphorous, may be used as the dopant. The n-type dopant atoms may be implanted at a dosage of about $1 \times 10^{13}$ atoms/cm$^2$ to about $1 \times 10^{15}$ atoms/cm$^2$ and an implantation energy of about 4 KeV to about 40 KeV, which may depend on the desired junction depth for bit lines 250. Bit lines 250 may, for example, be formed to a width ranging from about 200 Å to about 600Å and a depth ranging from about 200 Å to about 3,000 Å.

Turning now to the protection area illustrated in FIG. 2B, the protection area may be formed as an N-well diode. Alternatively, the protection area may be formed using other diode configurations, such as a P-well diode configuration. For explanatory purposes, the description that follows will focus on an N-well diode configuration.

As illustrated in FIG. 2B, the protection area may include an N-well 260, a p+ region 270, and an n+ region 280. As set forth above, the protection area may be formed simultaneously with the formation of the core structures, before the formation of the core structures, or after the formation of the core structures. N-well 260 may be formed in layer 210 of p-type material via one or more implant processes. N-well 260 may be formed in layer 210 by implanting an n-type material, such as phosphorous or arsenic, into layer 210. In one implementation, N-well 260 may be formed as a low voltage N-well (LVNW).

P+ region 270 may include a heavily doped p-type region that is formed in N-well 260. In one implementation, p+ region 270 may be formed by implanting a p-type material, such as boron or indium, in N-well 260.

N+ region 280 may include a heavily doped n-type region that is formed in N-well region 260 and layer 210. In one implementation, n+ region 280 may be formed by implanting an n-type material, such as phosphorous or arsenic, in N-well 260 and layer 210. It will be appreciated that in the case of a P-well diode, the locations of p+ region 270 and n+ region 280 will be reversed.

A dielectric layer 290 may be formed on top surface of the protection area of semiconductor device 200. Dielectric layer 290 may comprise silicon oxide, formed to a thickness ranging from about 200 Å to about 2000 Å. Dielectric layer 290 may be thermally grown or deposited.

Figure 3A:
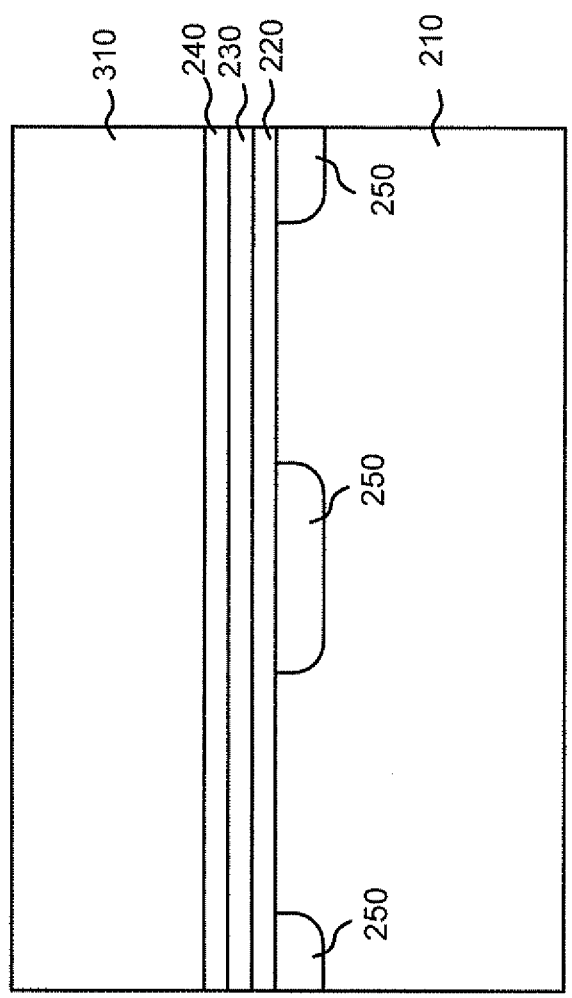
Figure 3B:
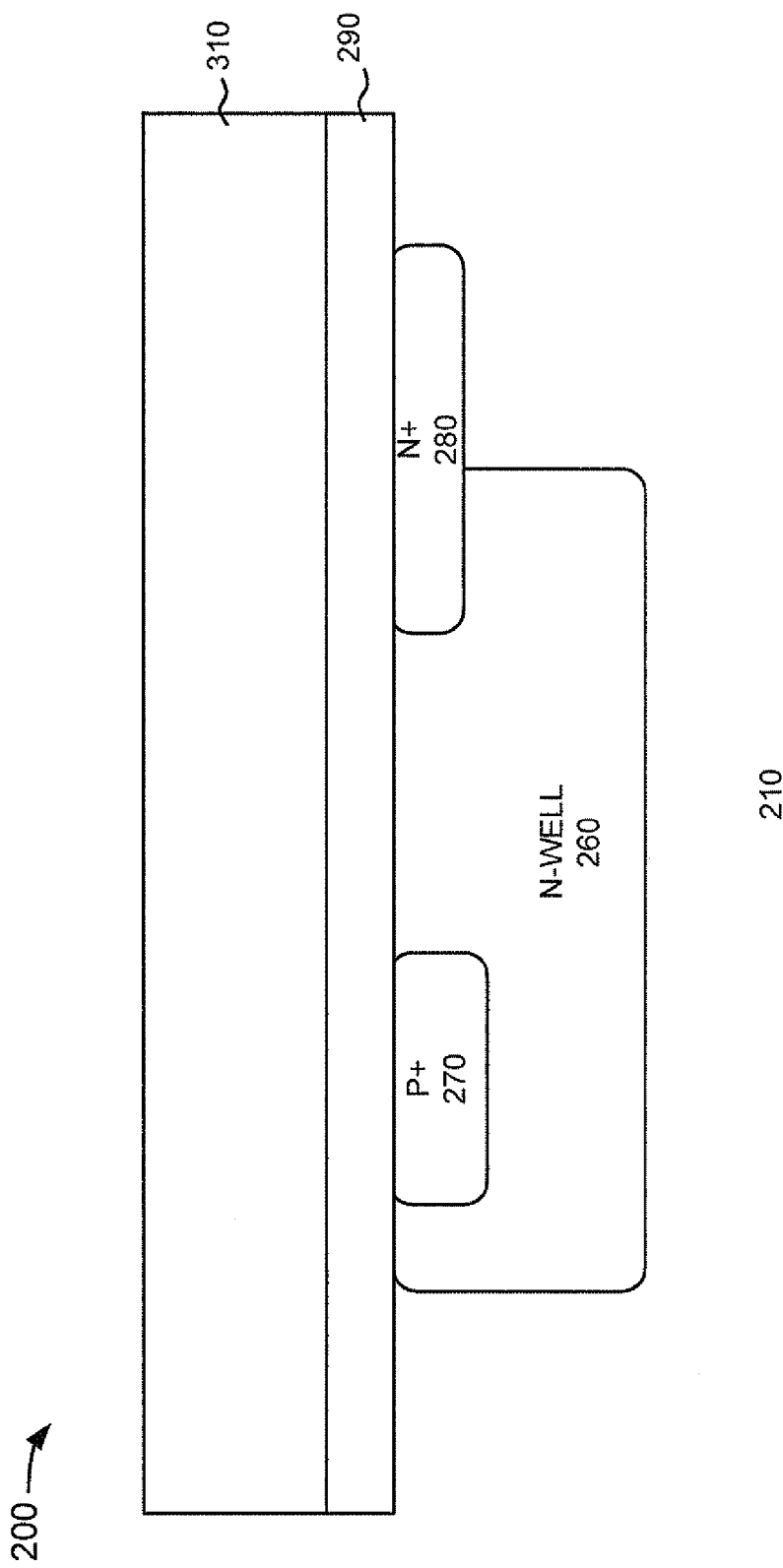

A conductive layer 310, such as a polysilicon layer, may be formed oil a top surface of semiconductor device 200 (act 110), as illustrated in FIGS. 3A and 31B, where FIG. 3A corresponds to the core structure area of semiconductor device 200 and FIG. 3B corresponds to the protection area of semiconductor device 200. In the core structure area of semiconductor device 200, conductive layer 310 may be patterned and etched to form word lines over dielectric layer 240. As will be appreciated, word lines 310 may function as a control gate electrode. An optional silicide layer, such as titanium silicide (not shown) may be formed on conductive layer 310 in one implementation consistent with the principles of the invention.

Figure 4:
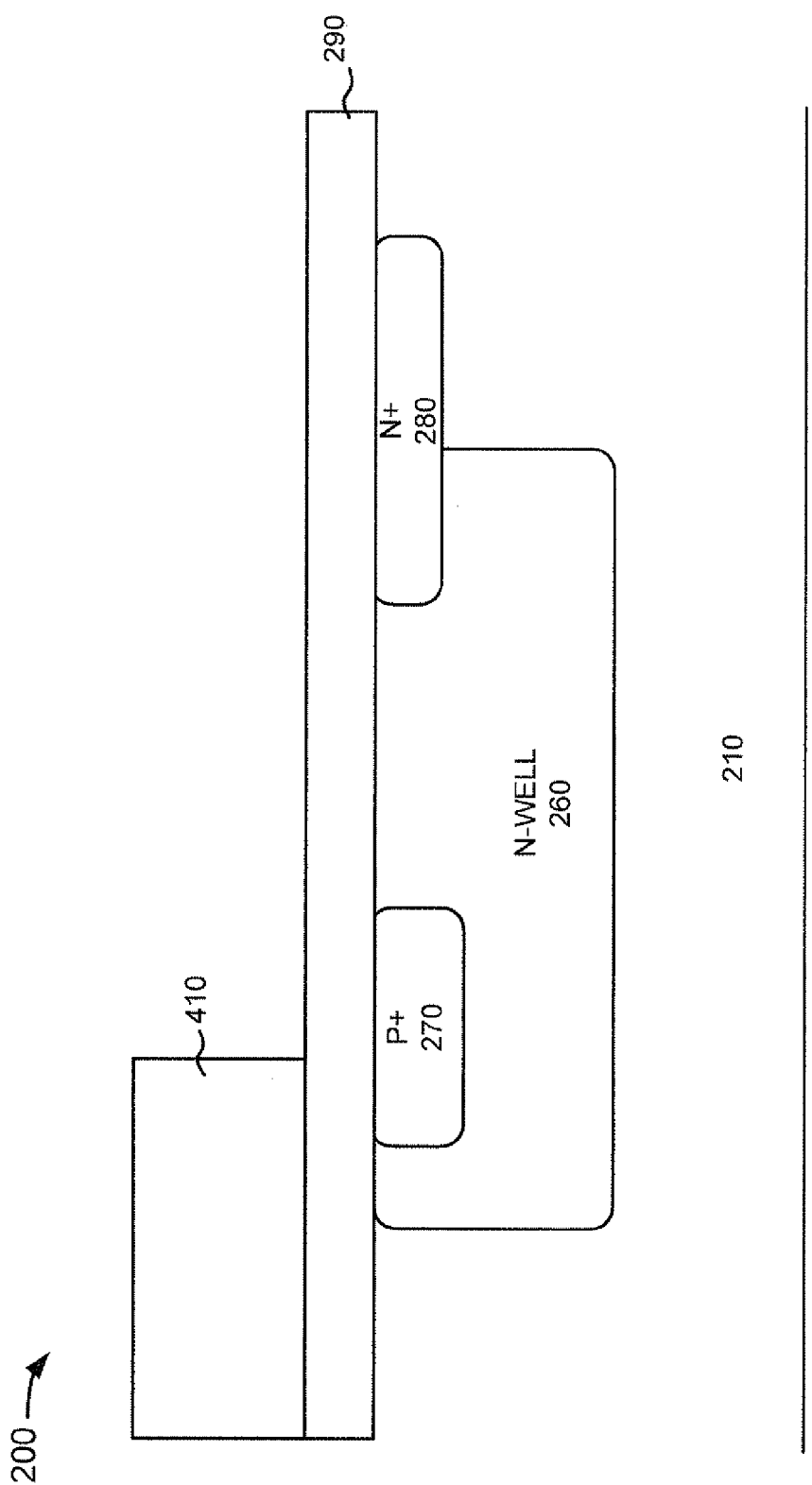

Outside of the core structure area of semiconductor device 200, conductive layer 310 may be patterned and etched in a conventional manner (act 110), as illustrated in FIG. 4, to form a conductive structure 410. For example, a photoresist material may be patterned and etched to form a mask on the top surface of conductive layer 310. Semiconductor device 200 may then be etched to form conductive structure 410. Referring to FIG. 4, layer 410 may be etched in a conventional maimer with the etching terminating at dielectric layer 290, thereby forming structure 410. Although not illustrated in FIG. 4, conductive structure 410 may extend to (i.e., connect to) the core structure or core structures for which protection is desired. In one implementation consistent with the principles of the invention, conductive structure 410 may connect to a word line 310 of the core structure (or core structures) and may act to extend word line 310 to the protection area.

Figure 5:
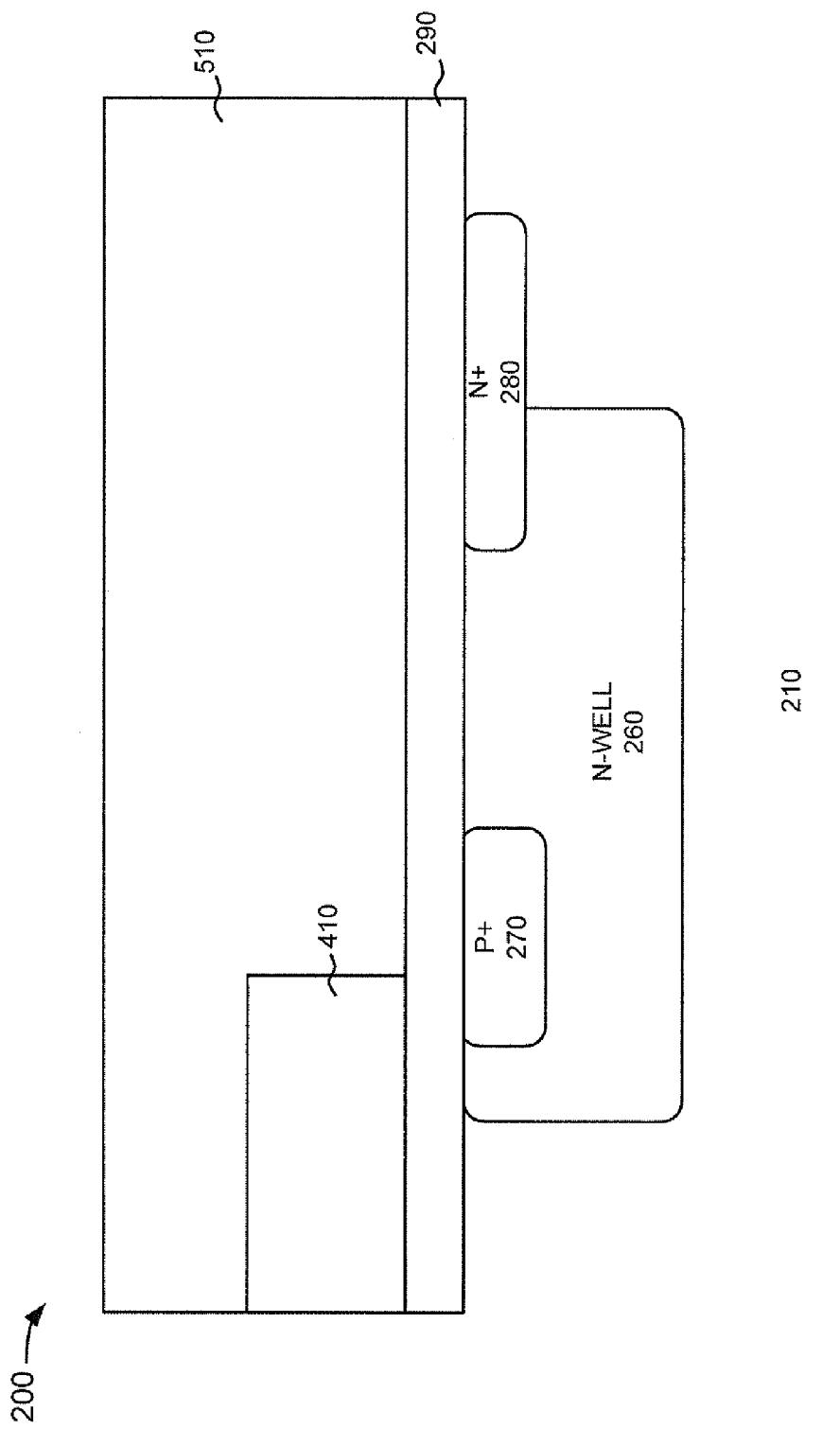

An inter-layer dielectric layer 510 may be formed on a top surface of semiconductor device 200 in a conventional manner (act 115), as illustrated in FIG. 5. In an exemplary implementation, inter-layer dielectric layer 510 may include an oxide, such as a silicon oxide (e.g., SiO$_2$), and may have a thickness ranging from about 500 Å to about 5,000 Å.

Figure 6:
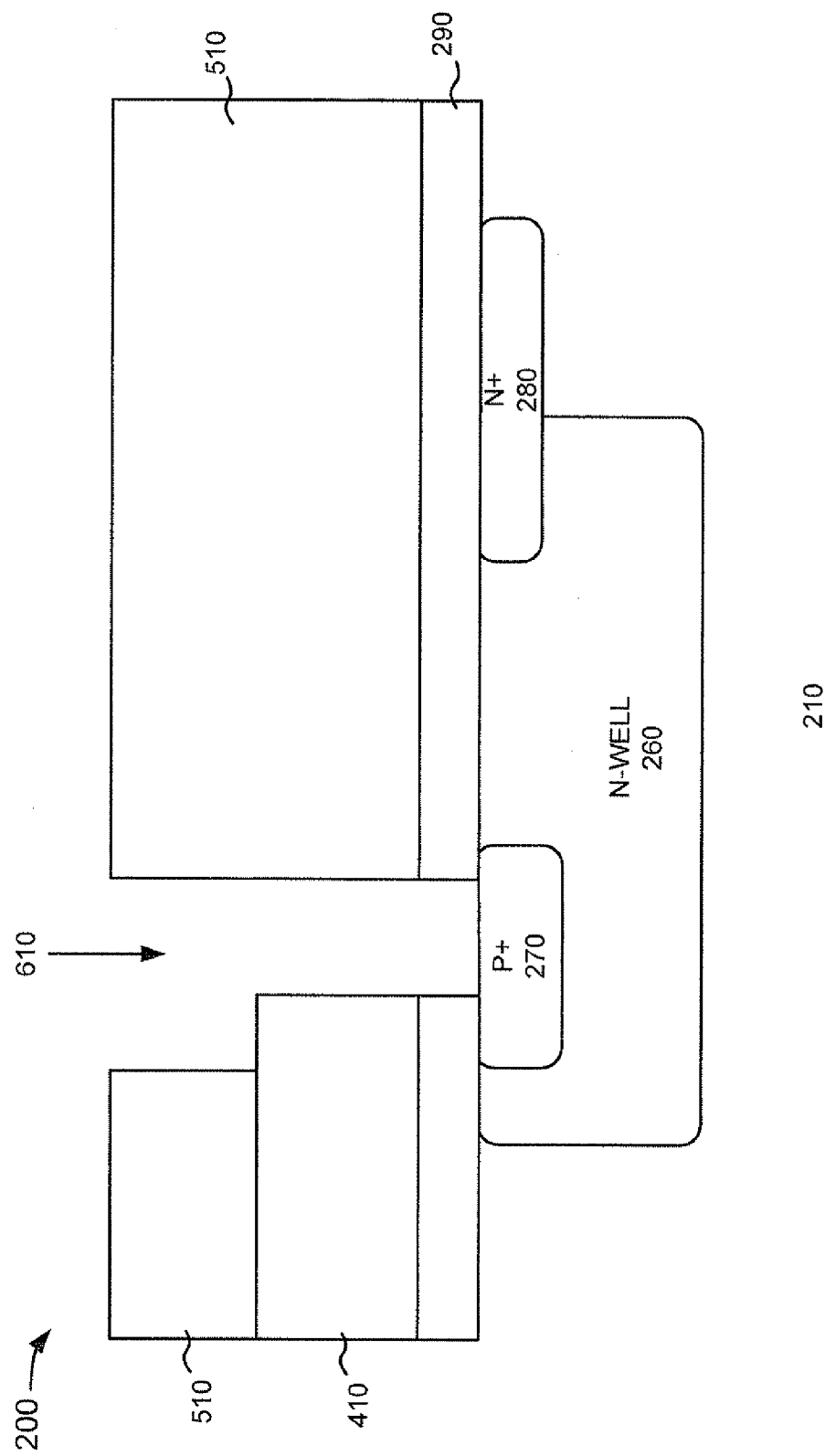

Semiconductor device 200 may then be etched to form a contact opening 610 (act 120), as illustrated in FIG. 6. Referring to FIG. 6, layers 510 and 290 may be etched in a conventional manner with the etching terminating at p+ region 270 to expose a portion of p+ region 270. In one implementation consistent with the principles of the invention, the portion of p+ region 270 that is exposed as a result of the etching may range from about 300 Å to about 3,000 Å. As further illustrated in FIG. 6, the etching may also cause a portion of the top surface of conductive structure 410 to be exposed. In one implementation consistent with the principles of the invention, the portion of the top surface of conductive structure 410 that is exposed as a result of the etching may range from about 300 Å to about 3,000 Å.

Figure 7:
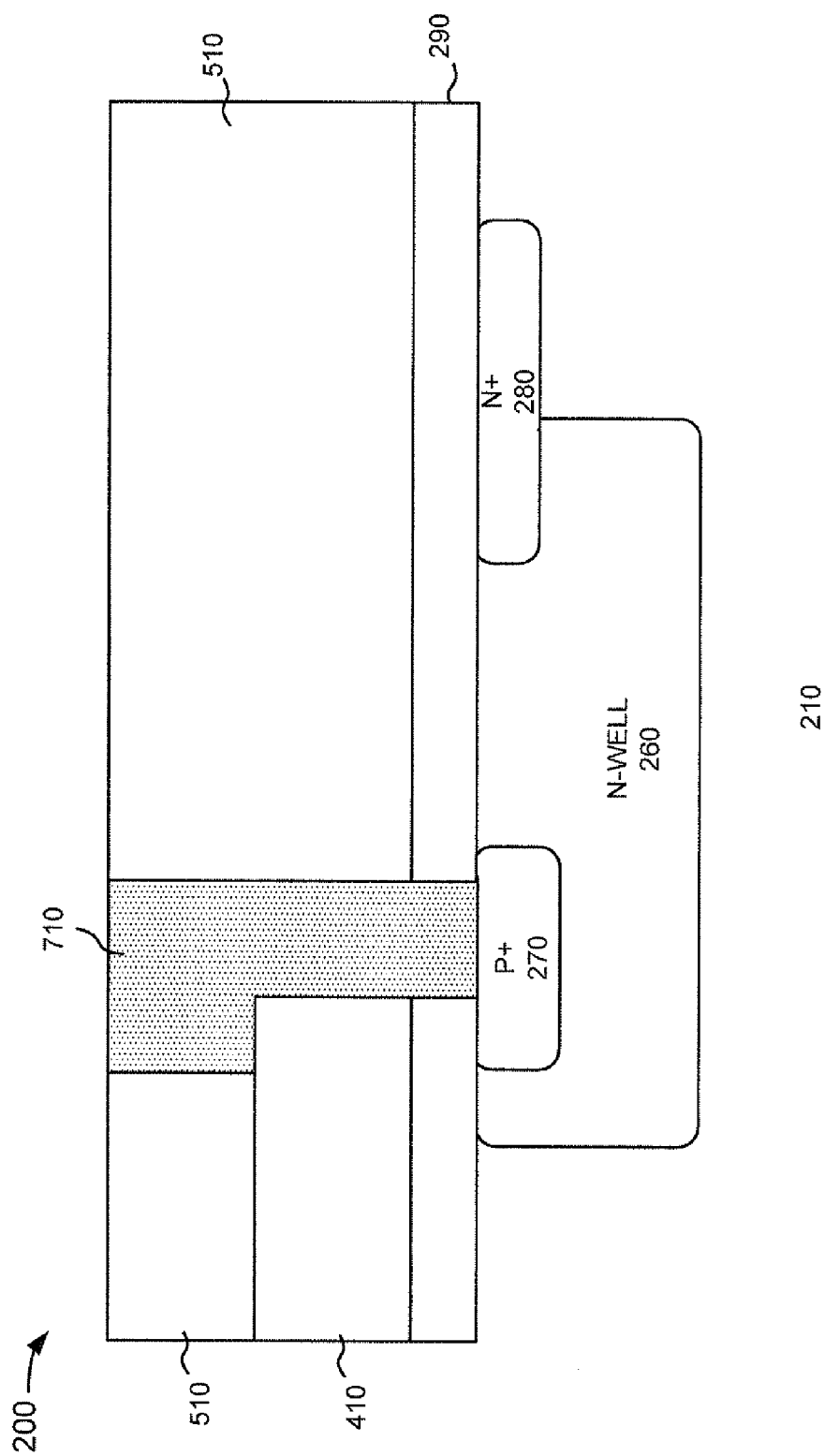

A conductive material may be formed in contact opening 610 (act 120), as illustrated in FIG. 7, to form a strapping contact 710. In one implementation consistent with the principles of the invention, the conductive material may comprise polycrystalline silicon, other semiconducting materials, such as germanium or silicon-germanium, or various metals, such as titanium or tungsten. As illustrated, strapping contact 710 is formed over and adjacent a portion of conductive structure 410, which may connect to word line 310 of the core structure to be protected, and the protection area. As such, strapping contact 710 may act to short word line 310 and the protection area together to protect against any possible charging that may occur during metal trench etching processes. Strapping contact 710 may be formed to a height ranging -from about 500 Å to about 5,000 Å.

Figure 8:
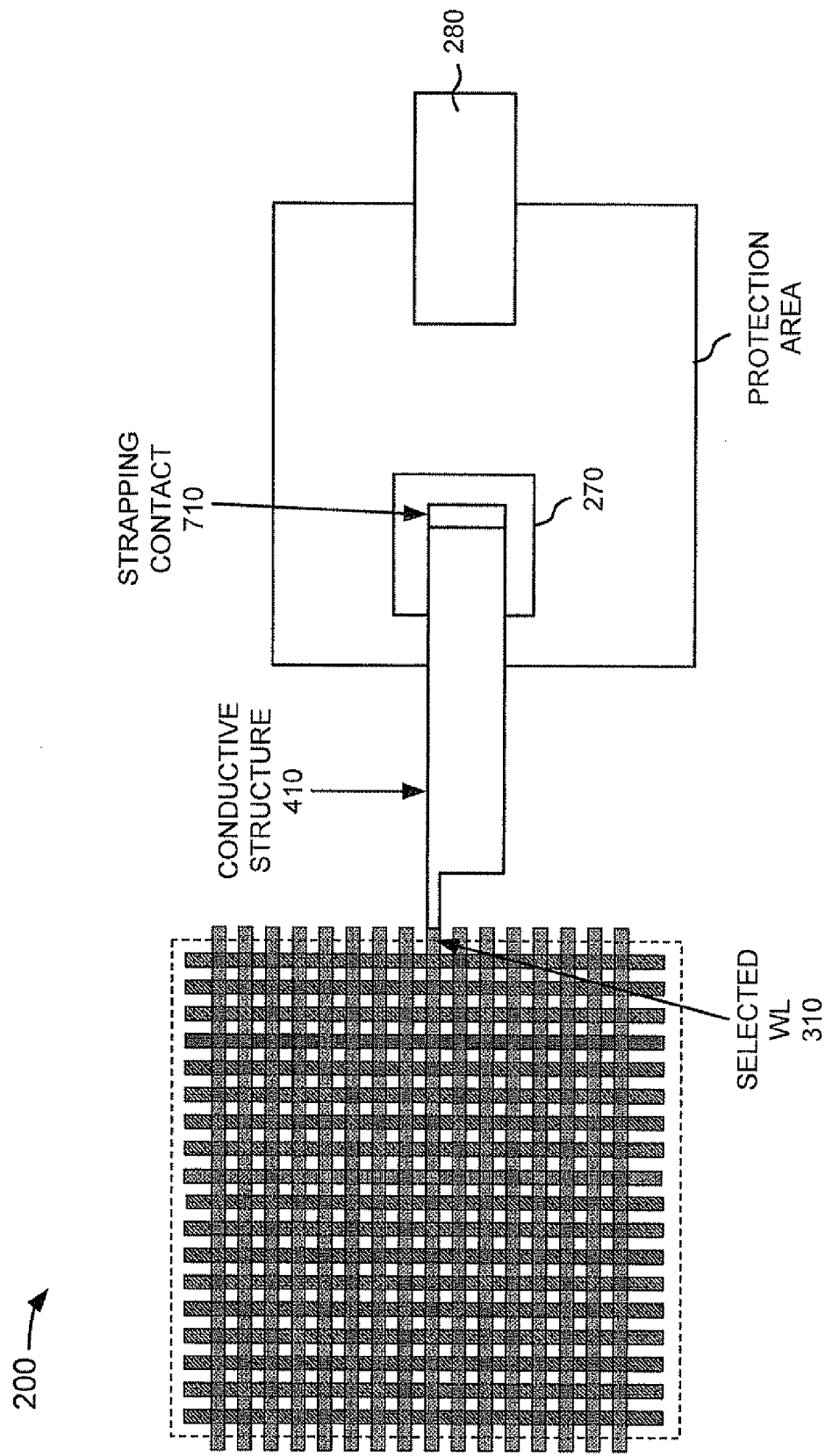

FIG. 8 illustrates an exemplary top view of semiconductor device 200 after formation of strapping contact 7 10. As illustrated, conductive structure 410 may act to extend a selected word line (WL) 310 to the protection area. Strapping contact 710 acts to short selected word line 310 and the protection area. Although one strapping contact 710 is illustrated in FIG. 8, it will be appreciated that strapping contact 710 may, in practice, be implemented as multiple strapping contacts. In one implementation consistent with the principles of the invention, strapping contact 710 may include multiple individual strapping contacts. In addition, each strapping contact 710 may connect to multiple word lines via a single conductive structure 410.

Figure 9:
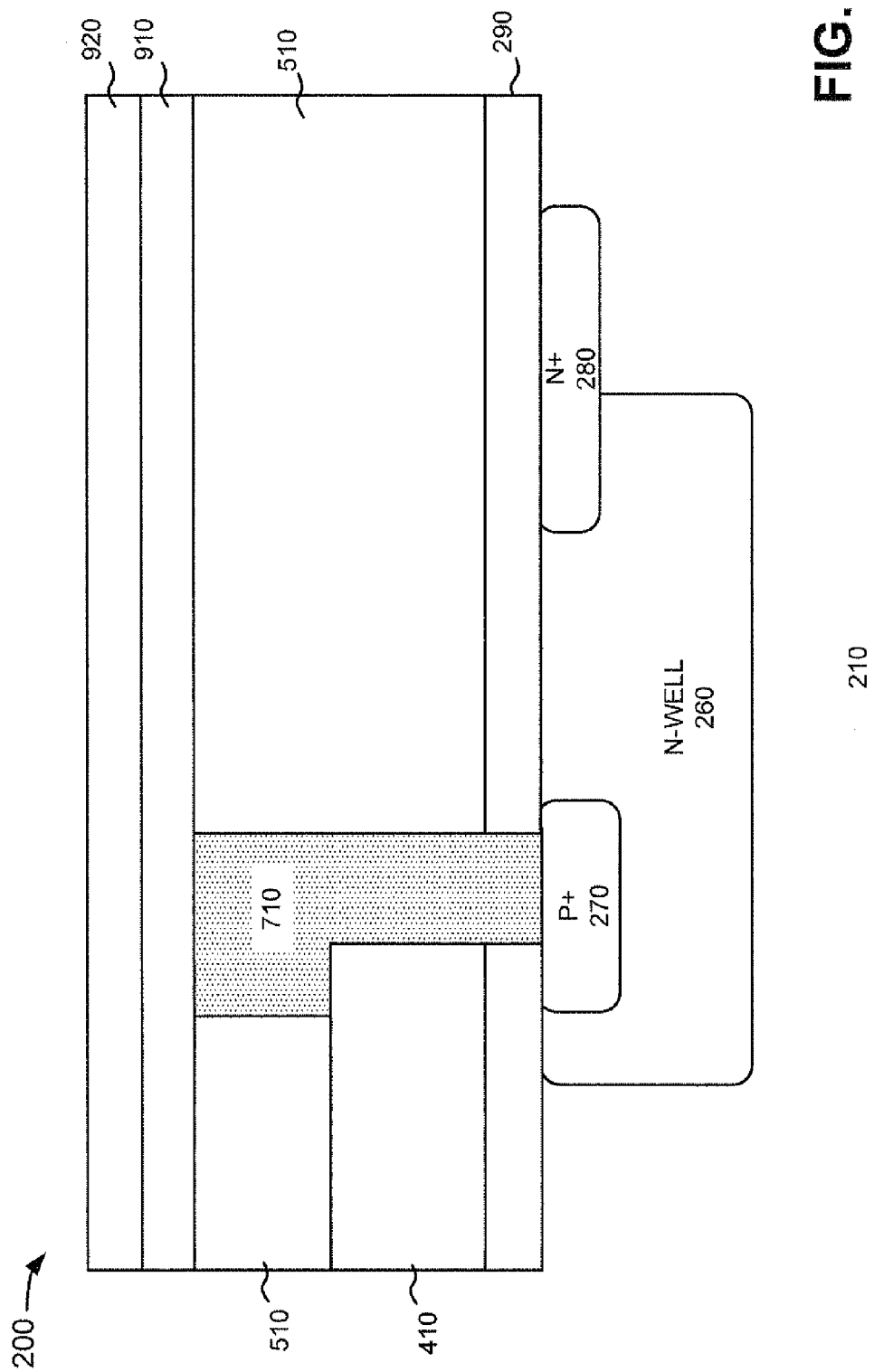

Once strapping contact 710 is formed, fabrication processing may continue with the formation of various interconnects based on the particular circuit requirements. For example, an inter-layer dielectric layer 910 and a conductive layer 920 may be formed on semiconductor device 200, as illustrated in FIG. 9 (act 125). In one implementation, inter-layer dielectric layer 910 may be an oxide, such as a silicon oxide, and conductive layer 920 may be a metal-1 layer, comprising a metal, such as copper, aluminum, or tungsten.

Conductive layer 920 may be etched to form an interconnect line on a top surface of semiconductor device 200. Conductive layer 920 may be etched in a conventional manner. As set forth above, strapping contact 710 may act to short word line 310 and the protection area together to protect against any possible in-line charging (e.g., charging that may occur during this metal-1 interconnect line formation).

Thus, in implementations consistent with the principles of the invention, a strapping contact is provided to provide charge protection.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the present invention. In practicing the invention, conventional deposition, photolithographic and etching techniques may be employed, and hence, the details of such techniques have not been set forth herein in detail.

While a series of acts has been described with regard to FIG. 1 the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A semiconductor device comprising:
a substrate;
a memory cell formed on the substrate, the memory cell including a word line;
a polysilicon structure connected to the word line;
a charge protection structure formed in the substrate; and
a strapping contact formed over and contacting a portion of a top surface of the polysilicon structure and abutting an end surface of the polysilicon structure, where the strapping contact shorts the word line and the charge protection structure.

2. The semiconductor device of claim 1 where the charge protection structure includes a low voltage N well.

3. The semiconductor device of claim 1 where the charge protection structure includes:
an N-well formed in the substrate,
a heavily doped p-type region formed in the N-well, and
a heavily doped n-type region formed in the N-well and the substrate.

4. The semiconductor device of claim 3 where the strapping contact directly connects to the polysilicon structure and the heavily doped p-type region.

5. The semiconductor device of claim 1 where the strapping contact includes a plurality of contacts, the memory cell includes a plurality of word lines, and the polysilicon structure is a single conductive structure via which each of the plurality of contacts connects to a corresponding one of the word lines.

6. The semiconductor device of claim 1 where the strapping contact is formed on the charge protection structure and has a height ranging from about 500 Å to about 5,000 Å.

7. The semiconductor device of claim 6 where the strapping contact has a width ranging from about 300 Å to about 3,000 Å.

8. The semiconductor device of claim 1 where the polysilicon structure is formed below a metal-1 layer of the semiconductor device.

9. The semiconductor device of claim 1 where the strapping contact protects the memory cell from in-line charging.

10. A semiconductor device comprising:
a substrate;
a memory cell formed on the substrate, the memory cell including a word line;
a protection area formed in the substrate;
a conductive structure extending from the word line to the protection area; and
a contact formed as an abutment contacting two different surfaces of the conductive structure, where the contact provides shorting of the word line and the protection area.

11. The semiconductor device of claim 10 where the protection area includes a diode structure.

12. The semiconductor device of claim 11 where the diode structure includes:
an N-well formed in the substrate,
a heavily doped p-type region formed in the N-well, and a heavily doped n-type region formed in the N-well and the substrate.

13. The semiconductor device of claim 12 where the contact connects to the conductive structure and the heavily doped p-type region.

14. The semiconductor device of claim 11 where the diode structure includes:
a P-well formed in the substrate,
a heavily doped n-type region formed in the P-well, and
a heavily doped p-type region formed in the P-well and the substrate.

15. The semiconductor device of claim 14 where the contact directly connects to the conductive structure and the heavily doped n-type region.

16. The semiconductor device of claim 10 where the conductive structure is formed below a metal-1 layer of the semiconductor device.

17. The semiconductor device of claim 10 where the strapping contact protects the memory cell from in-line charging.

18. The semiconductor device of claim 10 where the two different surfaces are substantially perpendicular to each other.

19. The semiconductor device of claim 10 where the contact contacts less than an entire surface area of one of the two different surfaces of the conductive structure and the contact contacts substantially an entire surface area of the other of the two different surfaces of the conductive structure.

20. The semiconductor device of claim 1 where the strapping contact contacts substantially an entire surface area of the end surface.

* * * * *